United States Patent [19]

Blad et al.

[11] 4,015,035
[45] Mar. 29, 1977

[54] METHOD OF FORMING FIBER-REINFORCED EPOXY COMPOSITE JOINTS, AND PRODUCT THEREOF

[75] Inventors: Leiv H. Blad, Van Nuys; Robert F. Warkow, Granada Hills, both of Calif.

[73] Assignee: Lockheed Aircraft Corporation, Burbank, Calif.

[22] Filed: Dec. 9, 1974

[21] Appl. No.: 530,523

Related U.S. Application Data

[62] Division of Ser. No. 279,703, Aug. 10, 1972, Pat. No. 3,885,071.

[52] U.S. Cl. .............................. 428/60; 156/158; 156/159; 156/629; 156/633; 428/195
[51] Int. Cl.$^2$ ...................... B32B 3/10; B32B 5/12; B29C 17/08; B65H 69/02
[58] Field of Search ............. 65/4; 156/2, 3, 7, 157, 156/158, 159, 304, 306, 8; 428/33, 60, 295, 114; 252/79.2

[56] References Cited

UNITED STATES PATENTS

| | | | |
|---|---|---|---|
| 3,195,219 | 7/1965 | Woodcock et al. | 65/4 X |
| 3,431,157 | 3/1969 | Mack | 156/182 |
| 3,481,807 | 12/1969 | Kanamori | 156/159 |
| 3,487,871 | 1/1970 | Kanamori | 156/304 |
| 3,689,341 | 9/1972 | Ninomiya | 156/304 |
| 3,770,555 | 11/1973 | Gladstone et al. | 156/306 |

OTHER PUBLICATIONS

IBM Technical Disclosure Bulletin, F. Anzalone et al., "Chemically Producing Holes in Epoxy Glass Material", vol. 10, No. 7, 12/67.

*Primary Examiner*—William A. Powell
*Attorney, Agent, or Firm*—George C. Sullivan; Lowell G. Turner

[57] ABSTRACT

An improved manufacture including a fiber-reinforced epoxy composite joint, and the method for producing same, in which the fibers of each of the composite adherends pass through and are intermeshed across the joint bondline. A scarfed mating surface is prepared on the end of each of the adherend elements-to-be-joined, after which a chemical etching of the mating ends to obtain exposed lengths of filaments or fibers is provided. A sheet of unsupported adhesive material is inserted between the scarfed and etched mating surfaces prior to their layup, after which heat and pressure are applied for bonding the joint. The exposed fibers of each element cross the bondline to intermesh with those of the other element during the melting of the unsupported adhesive. This process increases the joint efficiency to 83% of the efficiency of a non-joined element.

16 Claims, 7 Drawing Figures

METHOD OF FORMING FIBER-REINFORCED EPOXY COMPOSITE JOINTS, AND PRODUCT THEREOF

This is a division of application Ser. No. 279,703, filed Aug. 10, 1972, now U.S. Pat. No. 3,885,071.

BACKGROUND OF THE INVENTION

1. Field of the Invention

The field of art to which the invention is most likely to pertain is located in a class of art generally relating to fiber-reinforced epoxy composites. Class 156, Adhesive Bonding and Misc. Chemical Manufacture, and Class 74, Machine Elements and Mechanisms, U.S. Patent Office Classifications, may be the applicable general areas of art in which the claimed subject matter of the type involved here may be classified.

THE PRIOR ART.

Examples of the prior art in the arts to which this invention most likely pertains are U.S. Pat. Nos. 2,309,305; 2,429,119; 3,101,290; 3,194,702; 3,218,211; 3,481,807; 3,563,829; 3,589,959; 3,419,449; and 3,546,054.

PROBLEMS IN THE PRIOR ART

Previously the faying surfaces of fiber-reinforced epoxy composite adherends have generally been prepared by cleaning techniques such as sandblasting, tear plies, mechanical abrading, or solvent cleaning. Application of a supported adhesive to such faying surfaces was then undertaken, and the step of bonding the adherends would follow.

More particularly, heretofore, the composite joints of laminated epoxy matrices reinforced with, say, for example, graphite and boron fibers, have been relatively weak, for the reason that the supported adhesive contained a fabric to control the thickness of the bondline, and although the fibers of each element would be introduced to the bondline of the joint, they could never pass through such fabric to project through such bondline to effect an intermeshing or contiguity with the fibers of the other element contributing to the joint. The preparation of the elements forming the joint by, say, machining to effect scarfed surfaces, would never provide other than the mere tips of any exposed fibers to be introduced into, but never past, the bondline. As a result, the joint was severely restricted in transferring structural loads therethrough.

Another drawback in the use of epoxy composites heretofore, besides cost, has been the inability to produce joints with high efficiencies without adding new material. The addition of the new adhesive and reinforced laminate would severely affect the weight of the joint.

This invention substantially improves such load transferring capabilities and efficiencies, by strengthening the heretofore relatively weak joints by means of the intermeshing and contiguous lengths of fibers in the one scarfed element with similar lengths of fibers in the second scarfed element. The advantage of lightweightness is obtained with the resulting increased strength obtained at the joint.

SUMMARY OF THE INVENTION

This invention relates to the fabrication of joints formed of fiber-reinforced epoxy composites, and is more particularly concerned with a method of producing an improved epoxy composite joint having increased joint strength, and to the improved manufacture itself.

An object of this invention is to provide a fiber-reinforced epoxy composite joint having the characteristics of high strength and high fatigue resistance.

Another object of the invention is to increase the joint efficiency between two joined fiber-reinforced epoxy composite elements, heretofore never having been realized.

Another object of this invention is to eliminate required tight tolerances for scarfing purposes, demanding costly machining techniques, which heretofore have been utilized in known processes to form a fiber-reinforced epoxy composite joint of adequate strength.

Another object of this invention is to provide a fiber-reinforced epoxy composite joint having improved or increased load carrying and transfer characteristics.

Another object of this invention is to provide the facility of changing the dimensions of a manufacture (i.e., re-working it) by utilization of the subject matter of the invention.

A further object of the invention is to provide an economically producible joint for fiber-reinforced epoxy composite materials or elements.

Another object of this invention is to reduce the extent of the fabricating required of such a joint by eliminating the addition of new material for reinforcing the joint, thus reducing joint weight and economical costs, while providing lightweightness as a result of the increased strength of the joint.

A further object of this invention is to provide a repair technique which is now available at the point of in-place installation, as compared to removal and repair thereafter, all leading to economies in time, material and labor, and transportation.

A further object of this invention is to provide an improved joint between a fiber-reinforced epoxy composite element and metallic elements such as aluminum, titanium and steel, and the manufacture resulting therefrom.

Another object of this invention is to provide a novel manufacture by utilization of the disclosed process.

These and other objects and advantages of this invention will become more fully apparent upon a complete reading of the following description, the accompanying drawing, and the appended claims hereto.

DESCRIPTION OF THE PREFERRED EMBODIMENT

In practicing this invention, in order to acquire the desired strength and joint efficiency in an epoxy composite manufacture, the faying surfaces of adherends are first developed by preparing scarfed end portions on the fiber-reinforced materials-to-be-joined, and thereafter introducing such scarfed end portions to a chemical etchant whereby exposed lengths of fibers or filaments are obtained on the scarfed end portions. The fibers of the scarfed end portions of the adherends are exposed to a depth of, say, 0.010 inch, as a result of such etching or chemical removal of the resin in the material. Preferably, the range of length is 0.010 inch to 0.040 inch, however, the length may be longer. Afterwards, the scarfed end surfaces to-be-mated are cleaned; i.e., the etching acid is neutralized and any residual debris and fluids removed. They are then joined together with an unsupported adhesive material which comes in the form of a film or sheet. The unsupported adhesive is introduced to the ends prior to joining them together by utilization of known layup techniques, mechanical or otherwise. With heat and pressure applied during a subsequent bonding stage, such film melts, and the lengths of the fibers intermesh, resulting in physical contiguity of the fibers of the length of the etched portion of the adherends. The bonding of the adherends effects an improved epoxy composite joint.

As an illustrative embodiment of the subject matter of the invention, the preparation for, production of, and a manufacture including, an epoxy composite joint in accordance therewith and the necessary materials and process steps are described below.

Figure 1:
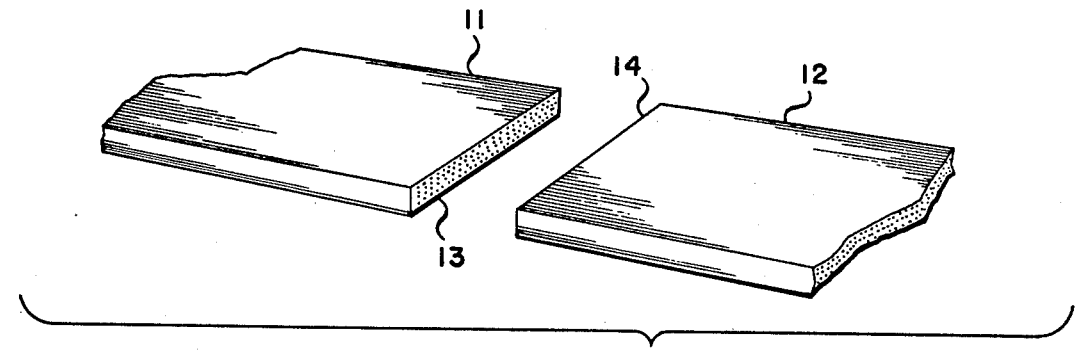
FIG. 1 is a perspective view of a pair of fiber-reinforced epoxy composite elements to be joined together.

Referring now to the drawing in which reference characters therein correspond to like numerals hereinafter, a particular composite formed of epoxy resins and fibrous materials is first shaped into a desired configuration 11, to be joined to a similar or like element 12 of the same epoxy nature, as shown in FIG. 1. Usually, a plurality of plies forming a laminate is included in such elements 11, 12. The shaping of such elements 11, 12 is not a part of the invention, as the final article of manufacture, including the composite joint, may vary extensively in dimensional characteristics, depending upon its purposes and applications, and such elements 11, 12 are fabricated in known manner prior to practice of the invention thereon. Each element 11, 12 comprises an epoxy matrix having fibers or filaments imbedded therein in a plurality of either unidirectional or multidirectional layers or plies. The multidirectional fibers in the layers or plies may be universally directed, insofar as practice of this invention is concerned. An end or terminal portion 13, 14 of each element 11, 12 is prepared, by machining or by other conventional and known techniques, to include an angle and to thereby provide scarfed mating surfaces 15, 16, respectively; that is, as shown in FIG. 2, the end portions of the members 11, 12 are provided with surfaces pitched or bevelled longitudinally of their respective elements.

The scarfed end surfaces 15, 16 are pitched or shaped to converge towards the extremity of their respective elements, each preferably at an angle of 4°, although this angle may vary. At best, machining techniques provide for only a 5° angle.

Figure 2:
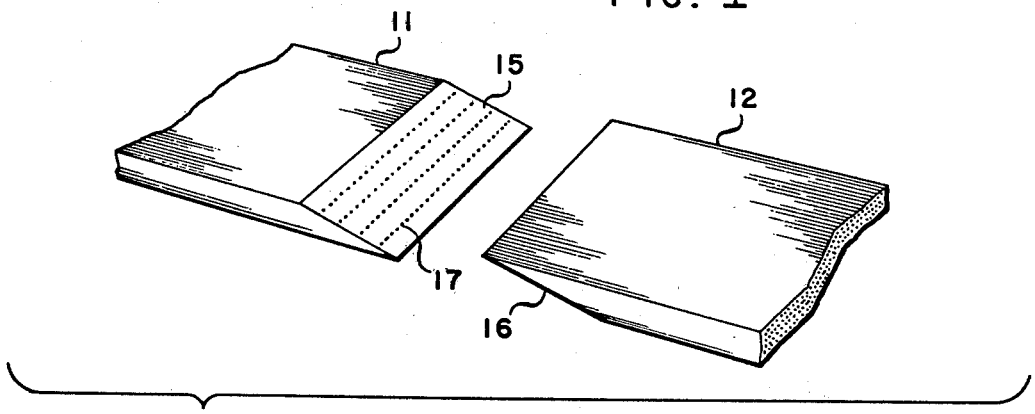
FIG. 2 is a perspective view of such elements after their sides or edges to-be-joined have been scarfed.
Figure 3:
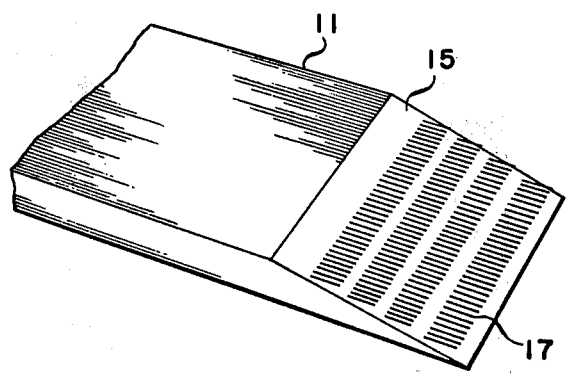
FIGS. 3, 4 and 5 illustrate, respectively, perspective, elevational and end views of such elements after the step of chemical etching.

In prior practice, as shown in FIG. 2, the mere tips 17 of the imbedded fibers would be exposed, with no further alteration made to the faying surface of its element 11. The same would occur, of course, to the corresponding element 12. Accordingly, the loads being transferred at a formed joint of such elements could pass only from one tip 17 in one adherend 11 to another tip in the other adherend 12.

In the practice of this invention, after the preparing step is completed, the elements 11, 12 are masked by suitable masking material (hereinafter, the maskant) except for the portions thereof which are to be chemically treated by the etchant. The maskant's function is to withstand the effects of the etchant, and as many layers as required to do so may be utilized. Various ways to mask the epoxy composite as a prelude to the etching step are available. For example, fluids which are acid resistant, such as those used in connection with chemical milling of metals, can constitute a maskant to be applied to either the entire specimen-to-be-etched or to the non-etched portion of the specimen which will come into contact with the etching fluid. In either case, after the maskant dries, it is then cut away in those areas of the specimen to be etched. Application of the maskant is performed by dipping the specimen in the fluid, or by spraying, and then drying the coated specimen in the open air. If necessary, multiple coats of maskant can be applied by repeating this technique. The portion of the specimen to be etched is then scribed and the maskant in that area peeled away. Following the etching step, which establishes the exposure of the fiber lengths, the remaining maskant is stripped or peeled off from the specimen and discarded.

Masking tapes also prove useful. Chemically resistant tapes, such as adhesive backed lead, aluminum, nylon, polyester, or similar suitable materials can be used to protect that portion of the specimen which is not to be etched.

Figure 4:
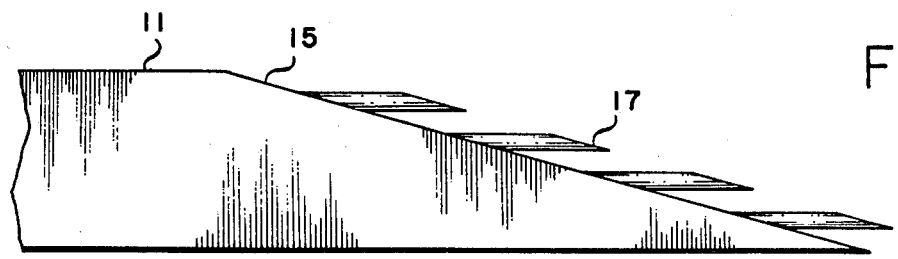
Figure 5:
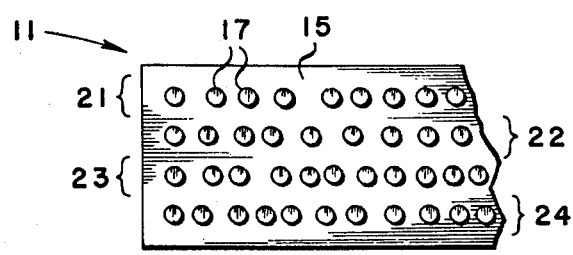
Figure 6:
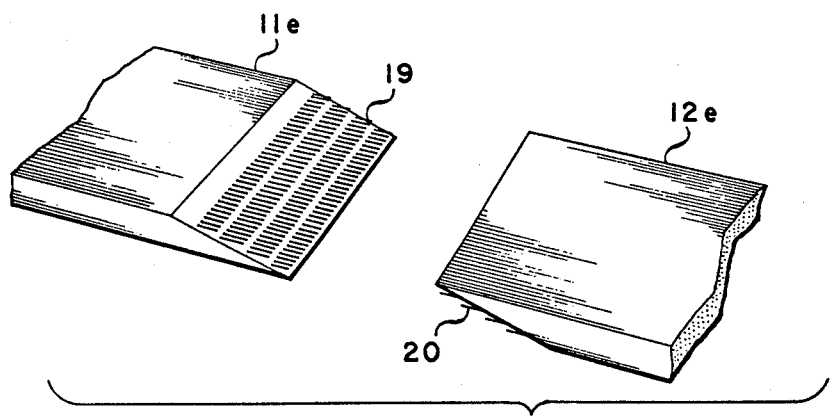
FIG. 6 is a perspective view of the scarfed and etched sides, ends or edges of such elements prior to joining same together.

In carrying out the etching step, portions of the elements 11, 12 including their mating surfaces 15, 16 are introduced into a bath for exposing, by chemical etching, lengths of fibers or filaments 19, 20 (FIGS. 4, 5 and 6) in their respective mating surfaces 15, 16. The etching bath may be contained within a metal tank lined with an organic plastic such as linear polyethylene or polypropylene lining, or with acid-proof brick and mortar. The elements 11, 12 may be supported in any suitable manner, such as by merely hanging from a wire, realizing that etching occurs uniformly inwardly from the scarfed mating surfaces. The results of such etching is to remove by dissolving the epoxy matrix from around and about a given length of all fibers or filaments and as shown in FIGS. 4 and 6. By this step, the available surface area of the fibers 19, 20 of both adherends 11, 12, for promoting their contiguity, is increased up to 300%, thus, ensuring substantially improved load carrying characteristics in the composite joint. An advantage resulting from this lies in the fact that the loads are transferred through the joint in the same plane as both of the adherends, thus, reducing the stress which heretofore resulted in high fatigue.

The lengths of the exposed adherend portions are preferably, as mentioned, 0.010 inch to 0.040 inch, although such exposed length is not limited to 0.040 inch. The amount of time in which the elements or adherends 11, 12 are immersed in the etchant is dependent upon the depth of the chemical etching of their matrices which is desired. Furthermore, a uniform etching results in the sense that the complementary angles of the scarfed mating surfaces 15, 16 are not materially or substantially altered. The results of the etching is a plurality of exposed lengths of fibers or filaments 19, 20 extending from the cooperating complementary ends-to-be-joined of the adherends 11, 12.

It may be noted here that the plurality of plies or layers 21, 22, 23, 24, . . . (FIG. 4) of fibers incorporated in the epoxy composite adherends may be unidirectional or multidirectional, as the case may be, and the process is applicable to one as equally as to the other.

A typical procedure used for etching a fiber-reinforced epoxy composite is described as follows:

1. The masked specimens are placed in a solution of hot sulfuric acid sodium dichromate mixture for a sufficient period of time to remove the resin to a depth of 0.010 inch to 0.040 inch or more, as desired. Other solutions may also be utilized where suitable.
2. The specimen is withdrawn from the bath and rinsed with tap water to remove any residual acid.
3. The specimen is submerged in a mild alkaline cleaner to neutralize all of the specimen. An example of such a cleaner is a non-silicated alkaline with good wetting or low surface tension properties.
4. The etched specimen is rinsed with tap water.
5. Any partially digested resin or residual insolubles or fluids is removed from the exposed fibers by air-water pressure blasting or ultrasonic wave cleaning.
6. The protective masking coating is removed and the total element is rinsed in tap water.
7. The specimen is dried to drive off any residual moisture.

As indicated by the above procedure, the etched adherends 11e, 12e (FIG. 6) are flushed with a suitable neutralizer and water after removal from the etching bath. The neutralizer, of course, neutralizes any remaining acid while the water removes any chemicals sitting on the mating surfaces and fiber lengths. The etched and neutralized specimens are then subjected to a secondary cleaning step to remove any residual fluids or etched debris such as minute chunks of resin. The secondary cleaning step could be ultrasonic wave or water jet applications as required, by means of known devices providing such applications. The cleaned specimens are then dried.

Figure 7:
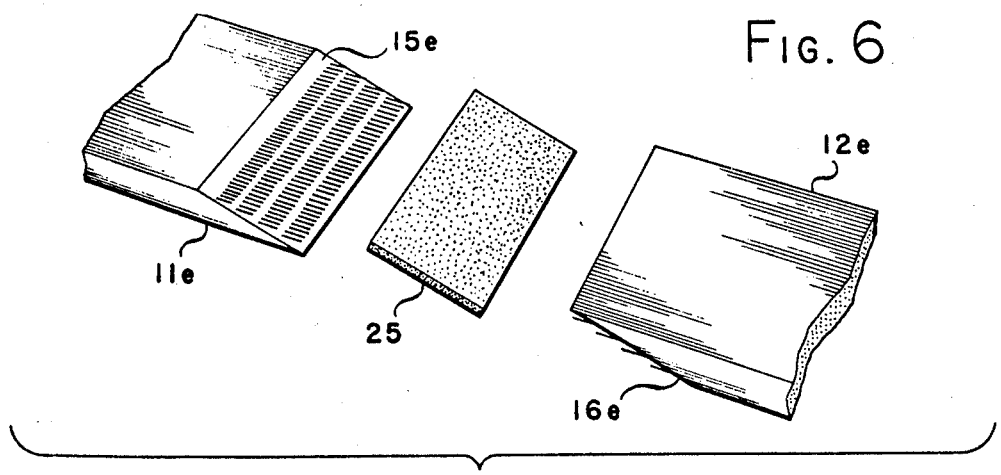
FIG. 7 is a perspective view of such elements immediately prior to the laying up step and after introduction of unsupported adhesive material between the elements-to-be-joined.

The next step is to lay up the joint being formed by the etched elements 11e, 12e, whereby the fibers are encapsulated by the resin or epoxy matrix. In this stage of the process, an unsupported adhesive 25 in the form of a sheet is interposed (FIG. 7) between the etched scarfed mating surfaces 15e, 16e of such elements, and thence such elements are physically joined together.

The adhesive is unsupported in the sense that a fabric is not contained within it to carry or support the resins of the adhesive. This is an important advantage, as will become apparent hereinafter. The insertion or positioning of the unsupported adhesive material 25 between such mating ends may be accomplished in known or conventional manner. The matching of the etched scarfed mating portions of the adherends as they are brought together against the inserted unsupported adhesive is sought, and is readily obtained by carefully placing together these components. Locating and holding these components together, with the aid of tools and fixtures, are well known and used techniques in the art of laying up plastic materials.

Thereafter, the joint lay up is bonded, such as, for example, by or in vacuum bagging and autoclave pressure devices. These devices and techniques applicable to plastic articles being prepared for curing and bonding in such devices are well known in the trade and arts and need not be described here.

What occurs during curing is as follows. Without a fabric carrier contained within the adhesive 25 to prevent the promotion of the contiguity of the exposed or bared fibers in each adherend, the lengths of such fibers intermesh as the curing temperatures melt the adhesive. The pressure (vacuum) applied to the adherends causes the exposed or bared lengths of fibers in each adherend to intermesh with such lengths of the other adherend, increased fiber contiguity being assured across the bondline by the chemical etching which has produced sufficiently long lengths of such fibers. After setting up of the epoxy composite joint, the contiguous fibers, which are established by such intermeshing, are now able to transfer, across the bondline of the composite joint, structural loads the values of which were heretofore substantially less over those shown to be transferable in epoxy composite joints established by other than the practice of this invention and utilizing supported adhesives.

It should be understood that contiguity of the fibers does not necessitate a physical contact between the fibers of one adherend with the fibers of the other adherend. The resulting disposition of the fibers of both adherends across the bondline in the final manufacture which is sought may be likened to the disposition of the fibers which are disposed in their epoxy matrix for each adherend alone.

It should now be apparent that the limitations in the strength characteristics of prior epoxy composite joints were due to utilization of supported adhesives, as distinguished from unsupported adhesives. The supported adhesive materials existed in sheet form, however, they included a fabric carrier for the curing resin. The purpose of such incorporated fabric was to maintain control of the bond line thickness. Although such control was accomplished, the carrier, nevertheless, severaly restricted load transfer through the tips of the fibers at the mating surfaces. By the practice of this invention, maximum load transfer is accomplished, depending upon the extent of the depth effectuated by the chemical etching on the scarfed surfaces.

Results obtained by utilization of the process, and as compared to results obtained in using known or conventional processes, are shown by the following examples:

| | | | TENSILE SHEAR (PSI) | | | |
|---|---|---|---|---|---|---|
| JOINT OR LAMINATE NO. | GRAPHITE FIBER ORIENTATION | ANGLE OF SCARFED END | LAP SHEAR SAND BLASTED SURFACE | SCARF SAND BLASTED | SCARF ETCHED | % INCREASE IN SCARF STRENGTH |
| 6 | 8 plies (±5°) | 5°±1° | 3493 | 4694 | 5452 | 16 |
| 7 | 8 plies (±5°) | " | 3583 | 5400 | 6788 | 27 |
| 8 | 16 plies (±15°) | " | 2655 | 5640 | 6181 | 10 |

The (± 5°) represents the tolerance in degrees by which the fibers may be angularly displaced relative to the longitudinal axis of the elements-to-be-joined, however, it should be understood that the invention may be practiced on laminate plies having universally or multi-directionally disposed fibers.

In obtaining the above results, the etching bath period extended to 12 hours, was maintained at 150° F, and utilized a solution of hot sulfuric acid sodium dichromate mixture. It should be understood, however, that various factors may vary the etching step but which, nevertheless, do not limit the practice of the invention. These factors are: (1) the age of the etching solution, its varying concentrations, the temperature of the bath, and the nature of the epoxy being etched (some have fillers). For example, depending upon these factors, a range of the temperature contemplated is 130° F – 250° F, and the etching period may run up to as much as 20 hours.

The curing cycle for joining the unsupported adhesives used in obtaining the above results was as follows:

| Parameters | Joint or Laminate No. | | |
| --- | --- | --- | --- |
| | 6 | 7 | 8 |
| | Unsupported Adhesive | | |
| | FM 123-5 | FM 1000 | Epon 9602 |
| Temperature | 250° F | 350° F | 250° F |
| Pressure | 100 psi | 125 psi | 100 psi |
| Time at Cure Temperature | 1 hr. | 1 hr. | 1 hr. |
| Vacuum | Full | Full | Full |

The following epoxy-based adhesives, for example, have been found to be usable; FM 123-5 and FM 1000, which are manufactured by and available from the Bloomingdale Rubber Company, Havre de Grace, Md., a division of American Cyanamid and Epon 9602, available from the Dexter Corporation, Franklin St., Olean, N.Y. 14760.

In regard to the aforementioned mixture, which was utilized in obtaining the indicated results, the range of its constituents is as follows: sulfuric acid, 34.0 to 40.0 oz./gal.; sodium dichromate, 3.6 to 10.2 oz./gal.; with the balance being demineralized water.

It should be understood that the maximum temperature and maximum concentration of such mixture, for the purposes of carrying out the practice of the invention, are limited only by the nature of the maskant utilized in the practice of the invention.

The execution of the method should be evident from the above description; however, briefly, its procedure is approached, if necessary, by an operator referring to a series-of-fiber-orientations plan which sets out how the fibers of an epoxy composite article-to-be-made are to be oreinted in the development of such article. This, of course, is not part of the invention, is standard procedure, and determines the configured nature of the final manufacture to-be-developed. Such configuration is completed by known application of the epoxy resins to-be-used to such fiber orientation, and the one component of the final manufacture is fabricated by conventional methods. The other component, to be joined thereto, is likewise fabricated, or already exists as either a fiber-reinforcing adherend or metallic element and in good or damaged condition. In the matter of repair work, of course, both fabricated and metallic but damaged components already exist. Threafter, this invention is invoked to provide the joint that completes the final manufacture. The steps of preparing, scarfing, masking, etching, and laying up with the unsupported adhesive, in accordance with the invention as described above. Depending on the shape of the formed joint, suitable locating and holding operations are applied thereto in the layup step. The joint is then bonded by known vacuum bagging or autoclave devices and procedures used therewith.

In addition to graphite and boron fibers, glass, pitch blend, PRD-fiber 49 (a DuPont product), and carbon are examples of other inert fibers which may be utilized in the process. Examples of the nature of carbon and graphite yarns suitable for use in practicing this invention, although such practice is not limited thereto, are set out in U.S. Pat. No. 3,660,140, issued May 2, 1972. PRD-49 fibers are an E. I. DuPont de Nemours and Company, Inc. (Wilmington, Delaware 19898) high modulus organic fiber composition used for plastics reinforcement, and is available in the form of yarns and rovings for filament winding, collimated tapes and chopped fiber reinforcement, and as woven fabric for resin impregnation and lamination.

Examples of organic epoxy-based resins utiliZed to encapsulate the fibers, as well as being etchable about such fibers, are DLS 90 and DLS 77, commercially available from the Ciba Chemical & Dye Co., Fairlawn, New Jersey. Similarly, the epoxy resin PR 279 is commercially available from its manufacturer, Minnesota Mining & Mfg. Co., St. Paul, Minnesota 55101 and the resin BP 919 and is commercially available from its maker, Bloomingdale Rubber Co., supra. Examples of use for these fiber laminates include, but are not limited to, aircraft fairings, radomes, interior panels, rotor blades and filament wound pressure tanks.

The application of this process are as innumerable as there are elements to-be-joined with their large variety of configurations, shapes and dimensions. For example, in joining an existing laminate to a new one, this process may be applied to the repair of a damaged section in an assembly or subassembly of parts, or to the redesigning of an existing structure, or to extending the existing laminated article. In the case of joining a finished laminate to a metal part, the process has application to joining a wing skin to a wing joint or root end, or to join graphite to intermediate material to minimize galvanic corrosion. In this regard, the metallic element is cleaned in accordance with standards known in the particular industry. For example, a chemical cleaning on a metallic element (such as aluminum) to be joined to the fiber reinforced epoxy composite element provides the necessary abrading thereof for joining such elements together. Steel cleaning, of course, involves sand blasting. And so forth.

It should now be clear also, that reinforcement of existing parts with fiber epoxy laminates, by the application of this process, increases the stiffness or strength of the structural specimens.

Pursuant to the requirements of the patent statutes, the principle of this invention has been explained and exemplified in a manner so that it can be readily prar ticed by those skilled in the art to which it pertains, or with which it is most nearly connected, such exemplification including what is presently considered to represent the best embodiment of the invention. However, it should be clearly understood that the above description and illustrations are not intended to unduly limit the scope of the appended claims, but that therefrom the invention may be practiced otherwise than as specifically described and exemplified herein, by those skilled in the art, and having the benefit of this disclosure.

Therefore, what we claim as patentably novel is:

1. In a method of producing an improved joint wherein at least one element thereof is an epoxy composite adherend internally reinforced with fibers oriented in a substantially parallel relation and having a prepared mating portion including a beveled surface,
   the improvement comprising the steps of removing by an etching process the epoxy matrix of the adherend at the beveled surface of the mating portion to expose lengths of its reinforcing fibers, and
   utilizing an unsupported adhesive material between the etched mating surface portion of such adherend and an element to be joined to said adherend,
   whereby subsequent bonding of such adherend, adhesive, and the joined element provides for the intermeshing and contiguity of the lengths of fibers between such joined adherend and element to produce an improved joint.

2. The manufacture resulting from the practice of the method of claim 1.

3. The manufacture of claim 2 wherein the joined element also comprises a fiber-reinforced epoxy composite adherend.

4. The manufacture of claim 2 in which the reinforcing fibers of the adherend are selected from a class of substances comprising graphite, boron, glass, pitch blend, carbon, and high modulus organic fiber compositions.

5. In the practice of claim 1, the step of removing comprising
   masking the adherend whereby at least its mating surface portion is exposed
   introducing the mating surface portion into a chemical etching bath for a period of time whereby the desired length of fiber is exposed,
   withdrawing the adherend from the bath,
   stripping the adherend of its maskant,
   flushing the exposed lengths of fibers with an alkaline or acid neutralizer and water, and
   subjecting the adherend to a secondary cleaning step to remove any residual fluids or debris.

6. In the method of claim 5, the etching bath comprising a sulfuric acid sodium dichromate mixture, and the temperature of such bath being at least substantially 150° F.

7. A method of producing an improved bonded joint between at least one fiber-reinforced epoxy composite adherend having a prepared mating portion as a first element and a second prepared element, such elements forming a manufacture upon being bonded, comprising the steps of:
   masking the adherend whereby at least such prepared mating portion is exposed,
   introducing the mating portion of the adherend to an etchant whereby the epoxy matrix of the adherend is dissolved to expose lengths of the fibers thereof,
   withdrawing the adherend from such etchant,
   stripping the maskant from the adherend,
   flushing the exposed lengths of the fibers with a neutralizer and water,
   subjecting the adherend to a secondary cleaning step to remove any residual fluids or debris,
   drying the adherend,
   laying up a joint formed by the elements,
   inserting an unsupported adhesive material between such elements during the laying up thereof, and
   bonding the elements to form the joint.

8. The product made by the method of claim 7.

9. In the method of claim 7, the second prepared element comprising an adherend having similarly exposed lengths of fibers as those of the first element.

10. The manufacture made by the method of claim 9.

11. The method of claim 7 wherein the dissolving etchant is a sulfuric acid sodium dichromate mixture, and the temperature of the etchant is at least substantially 150° F.

12. The method of claim 11 wherein the period for exposing the mating portion of the adherend in the dissolving etchant is at least 12 hours.

13. A method for producing a fiber-reinforced epoxy composite joint having improved strength characteristics comprising in combination the steps of:
   preparing the elements to be joined together by forming portions having complementary mating surfaces thereon,
   masking portions of such elements other than such mating surface portions,
   chemically etching such mating surface portions to expose lengths of fibers,
   stripping the maskant from such elements,
   neutralizing and cleaning the etched mating surface portions formed and lengths of fibers exposed,
   introducing an unsupported adhesive between the etched mating surface portions of the elements to be joined,
   laying up said elements and unsupported adhesive to form the joint, and
   bonding the joint.

14. The manufacture as made by the method of claim 13.

15. The method of claim 13 wherein said etching step comprises
   introducing the mating surface portions into a dissolving bath formed of a solution of sulfuric acid sodium dichromate mixture at a temperature of at least 150° F.

16. The method of claim 15 wherein the period of dissolving time in the bath is at least substantially 12 hours.

* * * * *